United States Patent
Ota et al.

[11] Patent Number: 6,110,813
[45] Date of Patent: Aug. 29, 2000

[54] METHOD FOR FORMING AN OHMIC ELECTRODE

[75] Inventors: Yorito Ota, Hyogo; Hiroyuki Masato; Yasuhito Kumabuchi, both of Osaka; Makoto Kitabatake, Nara, all of Japan

[73] Assignee: Matsushita Electric Industrial Co., Ltd., Osaka, Japan

[21] Appl. No.: 09/054,498

[22] Filed: Apr. 3, 1998

[30] Foreign Application Priority Data

Apr. 4, 1997 [JP] Japan ................................ 9-086394
Apr. 11, 1997 [JP] Japan ................................ 9-093674

[51] Int. Cl.$^7$ ............................................. H01L 21/3205
[52] U.S. Cl. .......................... 438/597; 438/604; 438/605; 438/660; 438/662; 438/931
[58] Field of Search .......................... 257/77, 198, 774; 438/597, 660, 662, 666, 931, 604, 605, 571, 586

[56] References Cited

U.S. PATENT DOCUMENTS

| | | | |
|---|---|---|---|
| 4,990,994 | 2/1991 | Furukawa et al. | 257/77 |
| 5,124,779 | 6/1992 | Furukawa et al. | 257/77 |
| 5,641,975 | 6/1997 | Agarwal et al. | 257/76 |
| 5,976,641 | 11/1999 | Onishi et al. | 428/1.3 |

FOREIGN PATENT DOCUMENTS

| | | |
|---|---|---|
| 8-139048 | 5/1996 | Japan . |
| 08264468 | 10/1996 | Japan . |
| 09246471 | 9/1997 | Japan . |
| 10-284436 | 10/1998 | Japan . |

OTHER PUBLICATIONS

K. Fujimoto, et al., "A high performance GaAs MMIC transceiver for personal handy phone system (PHS)", Proceedings of 25$^{th}$ Europoean Microwave Conference, vol. 2, pp. 926–930, 1995.

C. Arnodo, et al. "Nickel and molybdenum ohmic contacts on silicon carbide", Institute of Physics Conference Series No. 142, pp. 577–580, 1996.

*Primary Examiner*—John Guay
*Assistant Examiner*—Alonzo Chambliss
*Attorney, Agent, or Firm*—McDermott, Will & Emery

[57] ABSTRACT

A first metal film and a second metal film, both of which are made of Ni or the like, are deposited on the upper surface of a substrate made of SiC. In such a state, the interface between the first metal film and the substrate and the interface between the second metal film and the substrate both form a Schottky contact. Next, laser light is irradiated from above the upper surface of the substrate only onto the first metal film on the substrate after the diameter of the top end of the laser light has been reduced. Thus, since the metal-semiconductor interface between the first metal film and the substrate is turned into an alloy owing to the energy of the laser light without heating the entire substrate, an ohmic contact can be formed in the interface between the first metal film and the substrate. As a result, an ohmic electrode can be constituted by the first metal film.

1 Claim, 7 Drawing Sheets

METHOD FOR FORMING AN OHMIC ELECTRODE

BACKGROUND OF THE INVENTION

The present invention relates to a method for forming an ohmic electrode on a substrate made of silicon carbide having a large band gap, and also relates to a semiconductor device in which a transmission amplifier required to exhibit high-output characteristics and a reception amplifier required to exhibit low-noise characteristics are integrally formed on a single substrate made of silicon carbide.

In recent years, semiconductors composed of silicon carbide (SiC) (hereinafter, simply referred to as "SiC semiconductors") have become an object of much attention as nextgeneration semiconductors, because the SiC semiconductors are advantageous in physical properties in view of the wide band gap thereof and because there are a substantially infinite amount of constituent elements for the SiC semiconductors. Since the SiC semiconductors have a crystalline structure formed by covalent bonds, the physical properties thereof are very stable. In addition, since the SiC semiconductors have a large band gap and a high melting point, heat treatment is required to be conducted at a high temperature in order to form an ohmic electrode on a substrate made of an SiC semiconductor.

Hereinafter, a conventional method for forming an ohmic electrode by conducting a heat treatment at a high temperature will be described as the first prior-art example with reference to FIGS. 6(a) to 6(c). FIGS. 6(a) to 6(c) show cross-sectional structures illustrating the sequential process steps of a conventional method for forming an ohmic electrode in a semiconductor device. First, as shown in FIG. 6(a), metal films 102 made of Ni or the like are formed on the upper surface of a substrate 101 made of SiC. In this state, an ohmic contact is not formed between the metal films 102 and the substrate 101, but a Schottky contact is formed therebetween.

Next, as shown in FIG. 6(b), the substrate 101 is inserted into the gap between heating coils 103a provided on the upper inner surface of a radio frequency heating oven 103 and heating coils 103a provided on the lower inner surface of the radio frequency heating oven 103, and then a heat treatment is conducted on the substrate 101 at a high temperature in the range from about 1000° C. to about 1600° C. As a result, an ohmic contact is formed between the metal films 102 and the substrate 101 because the metal-semiconductor interface between the metal films 102 and the substrate 101 is turned into an alloy. Consequently, ohmic electrodes 102A are completed as shown in FIG. 6(c). This method is disclosed, for example, by C. Arnodo et al., in "Nickel and Molybdenum Ohmic Contacts on Silicon Carbide", Institute of Physics Conference Series Number 142, pp. 577–580, 1996.

On the other hand, in recent years, remarkably downsized and performance-enhanced cellular phones have been rapidly popularized. Such a rapid popularization has resulted not only from the development of performance-enhanced batteries but also from the development of high-performance field effect transistors, gallium arsenide (GaAs) MESFETs in particular. A GaAs MESFET is a high-performance switching device exhibiting such excellent radio frequency characteristics as to attain various advantages such as low-voltage operation, high gain, high efficiency, low noise, low distortion and the like, and thus is used universally as a transmission/reception amplifier for portable terminal units including cellular phones. Recently, thanks to tremendous development in cutting-edge technologies, a conventional hybrid IC is on the verge of being replaced by a newly developed microwave monolithic IC (MMIC) in which both a reception amplifier section exhibiting low-noise characteristics and a transmission amplifier section exhibiting high-output characteristics are formed integrally on a single chip.

Hereinafter, a conventional transmission/reception amplifier having an MMIC structure will be described as the second prior-art example with reference to FIG. 10.

FIG. 10 shows a cross-sectional structure of a conventional MMIC in which a transmission amplifier and a reception amplifier are formed integrally on a single chip. As shown in FIG. 10, a high-output amplifier section 112 for transmission and a low-noise amplifier section 113 for reception are formed in a GaAs substrate 111 such that these sections are spaced from each other via a certain gap. The high-output amplifier section 112 is constituted by a MESFET having a relatively large gate width, while the low-noise amplifier section 113 is constituted by a MESFET having a relatively small gate width. See, for example, K. Fujimoto et al., "A high Performance GaAs MMIC Transceiver for Personal Handy Phone System (PHS)", 25$^{th}$ European Microwave Conference, Proceedings, Vol. 2, pp. 926–930, 1995.

However, the conventional method for forming an ohmic electrode, identified above as the first prior-art example, has various difficult problems to solve. Firstly, in accordance with the method, since a heat treatment is conducted at as high a temperature as the growth temperature of SiC crystals in order to form the ohmic electrodes 102A, damage is possibly done on the substrate 101. Secondly, in order to conduct a heat treatment at such a high temperature, a special apparatus such as the radio frequency heating oven 103 is required. Thirdly, in order to optimize the conditions during the heat treatment process, it is very difficult to control a temperature and an environmental gas. And finally, in order to monitor the safety against such a high-temperature process, the control/monitoring procedure becomes adversely complicated.

On the other hand, the MMIC, identified above as the second prior-art example, has the following problems. In the MMIC, GaAs, used as a material for the substrate 111, has a relatively low thermal conductivity of about 0.5 W/cm.K. Thus, if the output of the high-output amplifier section 112 is to be further increased, then the temperature of the substrate 111 is adversely raised. As a result, the low-noise characteristics of the low-noise amplifier section 113, resulting from the high electron mobility (=about 6000 cm.cm/Vs) of GaAs, are disadvantageously deteriorated. In consequence, it has heretofore been difficult to implement an MMIC of high-output type providing an output of several watts to several hundreds watts.

SUMMARY OF THE INVENTION

In view of the problems of the first prior-art example, the present invention has been devised firstly in order to form an ohmic electrode with ease on a substrate made of SiC. In addition, in view of the problems of the second prior-art example, the present invention has been devised secondly in order to enable a high-output amplifier section to supply a remarkably high output while minimizing the deterioration in low-noise characteristics of a low-noise amplifier section owing to a high temperature.

In order to accomplish the first objective, the present invention implements an ohmic contact by irradiating laser light onto a metal film formed on a substrate made of silicon carbide.

In order to accomplish the second objective, according to the present invention, a substrate made of SiC having a higher thermal conductivity than that of GaAs is used. A high-output amplifier section is formed on the substrate. An epitaxial film made of a Group III–V compound, particularly $Al_xIn_yGa_{(1-x-y)}$ (where $0 \leq x \leq 0$ and $0 \leq y \leq 0$) having a lattice constant approximately equal to that of SiC, is selectively formed on the substrate. And a low-noise amplifier section is formed over the epitaxial film.

The first method for forming an ohmic electrode according to the present invention includes the steps of: depositing a metal film on a substrate made of silicon carbide; and forming an ohmic electrode of the metal film by heating the metal film through irradiation of laser light onto the substrate and thereby forming an ohmic contact between the metal film and the substrate, whereby the first objective of the present invention is accomplished.

In the first method of the present invention, an ohmic contact is formed between a metal film and a substrate made of silicon carbide by heating the metal film, deposited on the substrate, through irradiation of laser light onto the substrate. Thus, an ohmic electrode can be formed of the metal film at room temperature. In other words, since a heat treatment is not performed on the entire substrate at a high temperature, the substrate is less likely to be thermally damaged. In addition, since a special apparatus such as a radio frequency heating oven is no longer necessary, the need for performing a complicated process control can be eliminated. As a result, an ohmic electrode can be formed easily on the substrate made of silicon carbide.

In the first method of the present invention, the step of forming an ohmic electrode preferably includes a step of irradiating laser light, having a top end of a reduced diameter, onto the metal film. In such a case, if a plurality of metal films are formed on the substrate made of silicon carbide, then one of the metal films may be turned into an ohmic electrode and another metal film may be turned into a Schottky electrode. Accordingly, a Schottky diode and a MESFET may also be formed by performing the step of forming an ohmic electrode only once.

The second method for forming an ohmic electrode according to the present invention includes the steps of: deositing positing a first metal film on a substrate made of silicon carbide; depositing a second metal film on the first metal film by a plating technique; and forming an ohmic electrode of the first and the second metal films by heating the first and the second metal films through irradiation of laser light onto the substrate and thereby forming an ohmic contact between the first metal film and the substrate, whereby the first objective of the present invention is accomplished.

In the second method of the present invention, a first metal film is deposited on a substrate made of silicon carbide, bide, a second metal film is further deposited on the first metal film by utilizing a plating technique, and then an ohmic mic contact is formed between the first metal film and the substrate by heating the first and the second metal films through the irradiation of laser light onto the substrate. Thus, an ohmic electrode can be formed of the first and the second metal films at room temperature. Moreover, if the laser light is irradiated from above the upper surface of the substrate, then the second metal film can absorb the laser light more easily and an ohmic electrode can be formed with energy having a smaller intensity. This is because the reflectivity on the surface of the second metal film, which has been formed by a plating technique, is smaller than the reflectivity on the surface of a metal film, which has been formed by an evaporation technique or the like. Furthermore, the ohmic contact is less likely to be affected by the variations in reflectivity of the first metal film owing to the difference in degree of specular gloss and degree of cloudiness on the surface of the first metal film and by the difference in specific materials of the first metal film. Thus, the first metal film is uniformly heated over the entire surface irradiated with the laser light. As a result, an ohmic electrode having a satisfactory ohmic contact can be obtained with certainty.

The third method for forming an ohmic electrode according to the present invention includes the steps of: depositing a metal film on a surface of a substrate made of silicon carbide; and forming an ohmic electrode of the metal film by heating the metal film through irradiation of laser light from above a surface of the substrate and thereby forming an ohmic contact between the metal film and the substrate, the laser light having a wavelength sufficiently larger than a wavelength corresponding to energy associated with a band gap of silicon carbide, whereby the first objective of the present invention is accomplished.

In the third method of the present invention, a metal film is deposited on a surface of a substrate made of silicon carbide, and an ohmic contact is formed between the metal film and the substrate by heating the metal film through the irradiation of laser light from above the surface of the substrate. Thus, an ohmic electrode can be formed of the metal film at room temperature.

Moreover, since the wavelength of the laser light is sufficiently larger than a wavelength corresponding to the energy associated with the band gap of silicon carbide, the energy of the laser light is not absorbed into the substrate made of silicon carbide. Thus, only the metal film can be selectively heated even when the diameter of laser light is not reduced. As a result, the mass-productivity of the semiconductor device of this type can be increased.

The relationship between the wavelength $\lambda_{laser}$ of the laser light and the wavelength $\lambda_{sic}$ corresponding to the energy associated with the band gap of SiC is given by the following inequality:

$$\lambda_{laser} > \lambda_{sic} = h \cdot c / Eg$$

where h denotes Planck constant, c denotes the velocity of light and Eg denotes the band gap of SiC. These definitions will be applicable to the rest of this specification.

The fourth method for forming an ohmic electrode according to the present invention includes the steps of: depositing a metal film on a surface of a substrate made of silicon carbide; and forming an ohmic electrode of the metal film by heating the metal film through irradiation of laser light from below a reverse surface of the substrate and thereby forming an ohmic contact between the metal film and the substrate, the laser light having a wavelength sufficiently larger than a wavelength corresponding to energy associated with a band gap of silicon carbide, whereby the first objective of the present invention is accomplished.

In the fourth method of the present invention, the wavelength of the laser light is sufficiently larger than a wavelength corresponding to the band gap of silicon carbide. Thus even when the laser light is irradiated from below the reverse surface of a substrate, the energy of the laser light is not absorbed into the substrate, which is made of silicon carbide and has a metal film deposited on the upper surface thereof. Thus, only the metal film can be selectively heated. As a result, since an ohmic contact can be formed between the metal film and the substrate, an ohmic electrode can be formed of the metal film at room temperature. Furthermore, since the laser light is irradiated from below the reverse surface of the substrate, the interface between the metal and the semiconductor is directly heated and the influence of the thickness of the metal film constituting the electrode can be eliminated. As a result, an ohmic electrode can be formed with more certainty and the flexibility of the process can be improved.

The fifth method for forming an ohmic electrode according to the present invention includes the steps of: forming an insulator film on a substrate made of silicon carbide, the insulator film having an opening through which a surface of the substrate is exposed; depositing a metal film in the opening on the substrate; and forming an ohmic electrode of the metal film by heating the metal film through irradiation of laser light onto the substrate and thereby forming an ohmic contact between the metal film and the substrate, whereby the first objective of the present invention is accomplished.

In the fifth method of the present invention, an insulator film having an opening is formed on a substrate made of silicon carbide, so as to expose the surface of the substrate through the opening. A metal film is deposited in the opening. And then the metal film is heated through the irradiation of laser light onto the substrate, thereby forming an ohmic contact between the metal film and the substrate. As a result, an ohmic electrode can be formed of the metal film at room temperature.

Moreover, since the peripheral portions of the metal film on the substrate are covered with the insulator film, it is possible to prevent the upper surface of the substrate from being contaminated with the metal particles, which otherwise scatter over the upper surface of the substrate when the ohmic electrode is formed. As a result, the surface of the substrate can be kept clean with more ease and more certainty after the ohmic electrode has been formed.

The first semiconductor device of the present invention includes: a single substrate made of silicon carbide; an epitaxial film made of $Al_xIn_yGa_{(1-x-y)}N$ (where $0 \leq x \leq 1$ and $0 \leq y \leq 1$) and selectively formed on the single substrate; a power amplifier section formed on the single substrate; and a low-noise amplifier section formed on the epitaxial film, whereby the second objective of the present invention is accomplished.

In the first semiconductor device of the present invention, an epitaxial film made of a GaN group compound semiconductor is selectively formed on the single substrate made of SiC. A power amplifier section is formed on the SiC substrate having a high thermal conductivity of about 4.9 W/cm.K, while a low-noise amplifier section is formed on the epitaxial film having a high electron mobility of about 1000 cm.cm/Vs. Thus, if the power amplifier is used for transmission and the low-noise amplifier is used for reception, an MMIC exhibiting not only excellent high-output characteristics but also low-noise characteristics is realized.

Specifically, the substrate is made of SiC having a thermal conductivity and a breakdown voltage which are higher than those of GaAs by about one order of magnitude, and the power amplifier section is provided on the SiC substrate. Thus, the breakdown voltage and the operating voltage of the power amplifier are increased as compared with a power amplifier formed on a GaAs substrate. As a result, the output of the power amplifier can be increased by several tens times. In addition, an epitaxial film, made of a GaN group compound semiconductor which can be epitaxially grown, is selectively formed on the SiC substrate and the low-noise amplifier section is formed on the epitaxial film. Thus, a low-noise amplifier section can be formed with certainty while taking advantage of the high electron mobility of a GaN group compound semiconductor. As a result, an MMIC of a super high output power type, in which transmission/reception amplifiers are integrated and which has not heretofore been provided, is realized. Particularly because the low-noise amplifier section is made of a GaN group semiconductor having a wide band gap, the low-noise characteristics are not deteriorated even when the MMIC is operated at a high temperature.

In the first semiconductor device of the present invention, the epitaxial film preferably includes a barrier layer made of AlGaN and a well layer made of InGaN. In such a case, electrons can be confined within the well layer. Thus, the devices constituting the low-noise amplifier section can have a heterostructure allowing for further increase of the electron mobility. As a result, the low-noise characteristics can be further improved.

The second semiconductor device of the present invention includes: a single substrate made of silicon carbide; a first epitaxial film which is formed on the single substrate and made of $Al_xIn_yGa_{(1-x-y)}N$ (where $0 \leq x \leq 1$ and $0 \leq y \leq 1$) lattice-matching with silicon carbide; a second epitaxial film made of $Al_xIn_yGa_{(1-x-y)}N$ (where $0 \leq x \leq 1$ and $0 \leq y \leq 1$) and selectively formed on the first epitaxial film; a power amplifier section which is formed over the single substrate and which has a gate on the first epitaxial film; and a low-noise amplifier section formed on the second epitaxial film, whereby the second objective of the present invention is accomplished.

The second semiconductor device of the present invention can attain not only the effects attained by the first semiconductor device, but also an effect of further increasing the output of the power amplifier section. This is because the power amplifier section is formed on the first epitaxial film made of $Al_xIn_yGa_{(1-x-y)}N$ lattice matching with silicon carbide and having an even larger band gap than that of SiC, and thus has a higher breakdown voltage. In addition, since the SiC substrate and the first epitaxial film made of a GaN group compound semiconductor constitute a heterostructure, the electron mobility is increased. As a result, the electrical characteristics of the semiconductor device, such as gain, efficiency and the like required for a radio frequency power device, can be improved.

DETAILED DESCRIPTION OF THE INVENTION

Embodiment 1

Hereinafter, the first embodiment of the present invention will be described with reference to the drawings.

Figure 1A:
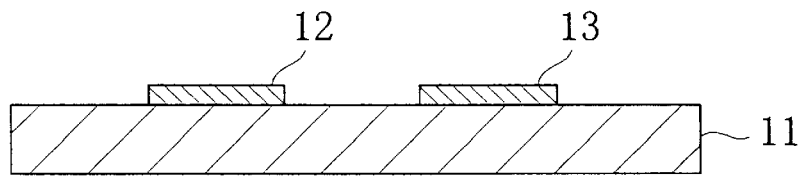
FIGS. 1(a) to 1(c) are cross-sectional views sequentially showing the process steps of a method for forming an ohmic electrode in the first embodiment of the present invention.
Figure 1B:
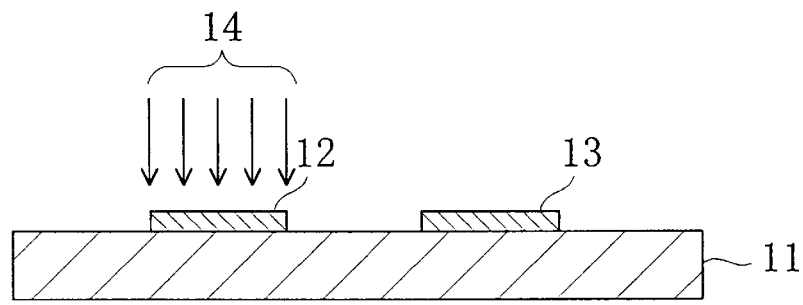
Figure 1C:
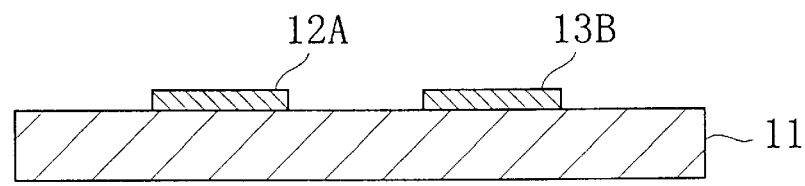

FIGS. 1(a) to 1(c) show the cross-sectional structures sequentially illustrating the process steps of a method for forming an ohmic electrode in the first embodiment of the present invention. First, as shown in FIG. 1(a), a first metal film 12 and a second metal film 13, which are both made of Ni or the like, are deposited on the upper surface of a substrate 11 made of SiC by an evaporation technique, for example. In this state, an ohmic contact has not been formed yet in the interface between the first metal film 12 and the substrate 11 and in the interface between the second metal film 13 and the substrate 11. In both of these interfaces, a Schottky contact has been formed.

Next, as shown in FIG. 1(b), laser light 14 is irradiated from above the upper surface of the substrate 11 onto only the first metal film 12 on the substrate 11 while reducing the diameter of the top end of the laser light 14. As a result, even if the substrate 11 is not heated, the metal-semiconductor interface between the first metal film 12 and the substrate 11 is turned into an alloy owing to the energy of the laser light 14. As a result, an ohmic contact is formed in the interface between the first metal film 12 and the substrate 11 and the first metal film 12 is turned into an ohmic electrode 12A, as shown in FIG. 1(c). On the other hand, the second metal film 13, which has not been irradiated with the laser light 14, is turned into a Schottky electrode 13B.

In this embodiment, the interface between the first metal film 12 and the substrate 11 is turned into an alloy by irradiating laser light 14 onto the first metal film 12 without heating the SiC substrate 11 in this manner. That is to say, since a heat treatment is not conducted at such a temperature as high as the growth temperature of SiC crystals, the substrate 11 is less likely to be damaged.

In addition, a special apparatus such as a radio frequency heating oven for conducting a heat treatment at a high temperature is no longer necessary and the need of performing a complicated process control for optimizing the conditions can be eliminated. Thus, an ohmic electrode can be formed easily on the substrate 11 made of SiC.

Moreover, if the laser light 14 is irradiated onto the first metal film 12 only after the diameter of the top end of the laser light 14 has been reduced, as is done in this embodiment, then metal films to have an ohmic contact and metal films to have a Schottky contact can be selectively formed from a plurality of metal films formed on the same substrate. Thus, Schottky diodes and MESFETs can be formed during a single process for forming an electrode.

It is noted that, if the laser light 14 is irradiated onto the entire surface of the substrate 11 without reducing the diameter of the laser light 14, then both the first metal film 12 and the second metal film 13 naturally have an ohmic contact.

Embodiment 2

Hereinafter, the second embodiment of the present invention will be described with reference to the drawings.

Figure 2A:
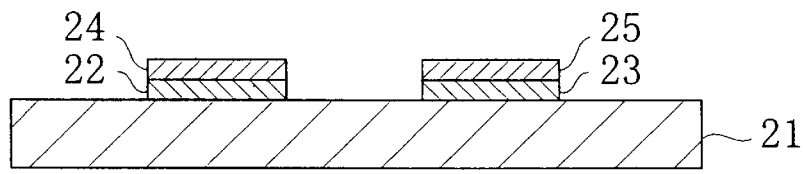
FIGS. 2(a) to 2(c) are cross-sectional views sequentially showing the process steps of a method for forming an ohmic electrode in the second embodiment of the present invention.
Figure 2B:
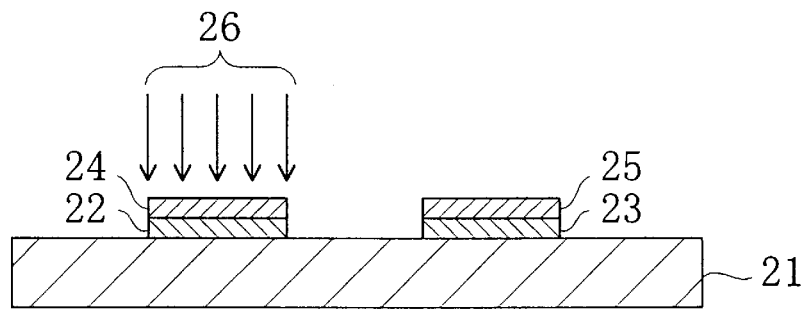
Figure 2C:
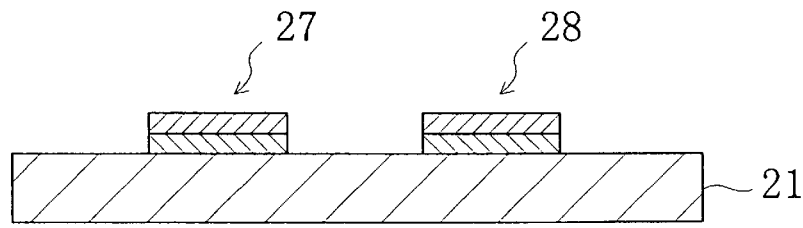

FIGS. 2(a) to 2(c) show the cross-sectional structures sequentially illustrating the process steps of a method for forming an ohmic electrode in the second embodiment of the present invention. First, as shown in FIG. 2(a), a first metal film 22 and a second metal film 23, which are both made of Ni or the like, are deposited on the upper surface of a substrate 21 made of SiC by an evaporation technique, for example. In this state, a Schottky contact has been formed in the interface between the first metal film 22 and the substrate 21 and in the interface between the second metal film 23 and the substrate 21. Thereafter, a first plated metal film 24 and a second plated metal film 25 are deposited on the upper surface of the first metal film 22 and on the upper surface of the second metal film 23, respectively, by a plating technique.

Next, as shown in FIG. 2(b), laser light 26 is irradiated from above the upper surface of the substrate 21 onto only the first plated metal film 24 over the substrate 21 while reducing the diameter of the top end of the laser light 26. As a result, even if the substrate 21 is not heated, the metal-semiconductor interface between the first metal film 22 and the substrate 21 is turned into an alloy, because the energy of the laser light 26 is thermally conducted from the first plated metal film 24 into the first metal film 22. Consequently, an ohmic contact is formed in the interface between the first metal film 22 and the substrate 21 and the first metal film 22 and the first plated metal film 24 are turned into an ohmic electrode 27, as shown in FIG. 2(c). On the other hand, the second metal film 23 and the second plated metal film 25, which have not been irradiated with the laser light 26, are turned into a Schottky electrode 28.

In general, the energy of laser light 26 is reduced by (1−reflectivity) times. The surface of the first and the second metal films 22 and 23, which have been formed through evaporation, substantially causes specular reflection. Thus, since almost all of the energy of the laser light 26 is reflected by these surfaces, the energy intensity of the laser light 26 is usually required to be set at a sufficiently high value.

However, in this embodiment, the first plated metal film 24 is formed by a plating technique on the upper surface of the first metal film 23, which has been formed by an evaporation technique or an epitaxy technique. Since the surface of the first plated metal film 24 does not cause specular reflection, the laser light 26 is efficiently absorbed into the surface. As a result, the ohmic electrode 27 can be formed at an even smaller energy intensity.

Furthermore, the electrode is less affected by the variations in reflectivity resulting from the difference in degree of specular gloss and the degree of cloudiness on the surface of the first metal film 22 and by the difference in the materials of the first metal film 22. Thus, since the electrode can be heated uniformly over the entire area irradiated with the laser light, a satisfactory ohmic electrode can be obtained.

Embodiment 3

Hereinafter, the third embodiment of the present invention will be described with reference to the drawings.

Figure 3A:
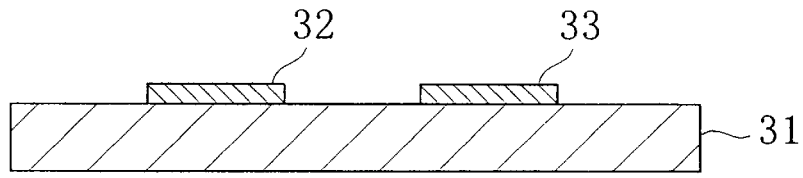
FIGS. 3(a) to 3(c) are cross-sectional views sequentially showing the process steps of a method for forming an ohmic electrode in the third embodiment of the present invention.
Figure 3B:
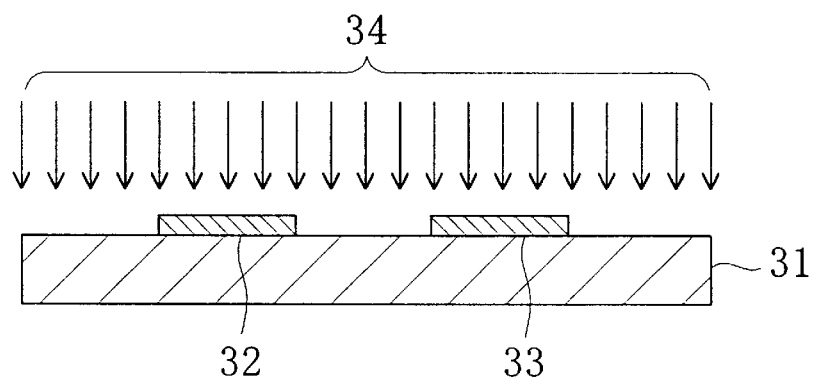
Figure 3C:
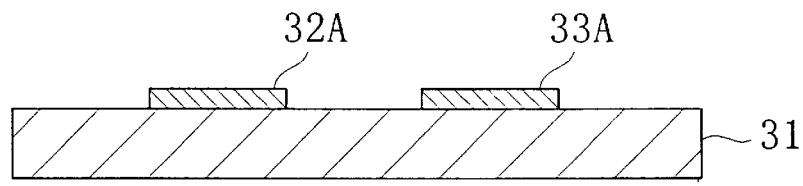

FIGS. 3(a) to 3(c) show the cross-sectional structures sequentially illustrating the process steps of a method for forming an ohmic electrode in the third embodiment of the present invention. First, as shown in FIG. 3(a), a first metal film 32 and a second metal film 33, which are both made of Ni or the like, are deposited on the upper surface of a substrate 31 made of SiC. In this state, a Schottky contact has been formed in the interface between the first metal film 32 and the substrate 31 and in the interface between the second metal film 33 and the substrate 31.

Next, as shown in FIG. 3(b), laser light 34 is irradiated from above the upper surface of the substrate 31 onto the entire surface of the substrate 31. In this embodiment, the laser light 34 has a wavelength sufficiently longer than the wavelength (=h·c/Eg) corresponding to the energy associated with the band gap (=Eg) of SiC. Then, even if the substrate 31 is not heated, the metal-semiconductor interface between the first metal film 32 and the substrate 31 and the metal-semiconductor interface between the second metal film 33 and the substrate 31 are each turned into an alloy owing to the energy of the laser light 34. Thus, an ohmic contact is formed in the interface between the first metal film 32 and the substrate 31 and in the interface between the second metal film 33 and the substrate 31. As a result, the first metal film 32 is turned into a first ohmic electrode 32A, and the second metal film 33 is turned into a second ohmic electrode 33A as shown in FIG. 3(c).

In this embodiment, since the laser light 34 has a wavelength sufficiently longer than the wavelength corresponding to the energy associated with the band gap of SiC, the laser light 34 is not absorbed into the SiC substrate 31, but transmitted therethrough. Thus, only the first metal film 32 and the second metal film 33 can be selectively heated without heating the substrate 31. As a result, the first ohmic electrode 32A and the second ohmic electrode 33A can be formed without doing thermal damage on the substrate 31.

SiC has various polytypes and the band gaps Eg thereof can be various values. For example, in the case of 6H-SiC, the band gap Eg thereof is about 3 eV and corresponds to a wavelength $\lambda_{siC}$=h·c/Eg=1.24/3=0.41 $\mu$m. Thus, by using a YAG laser device having a wavelength $\lambda_{laser}$=1.06 $\mu$m or a carbonate gas laser device having an even longer wavelength, a metal film can be selectively heated on a SiC substrate that has already been doped with donors or acceptors.

Variant of Embodiment 3

Hereinafter, a variant of the third embodiment will be described with reference to the drawings.

Figure 4A:
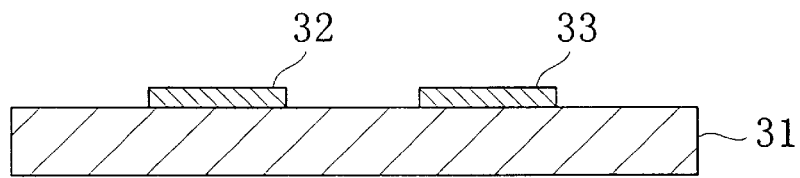
FIGS. 4(a) to 4(c) are cross-sectional views sequentially showing the process steps of a method for forming an ohmic electrode in a variant of the third embodiment of the present invention.
Figure 4B:
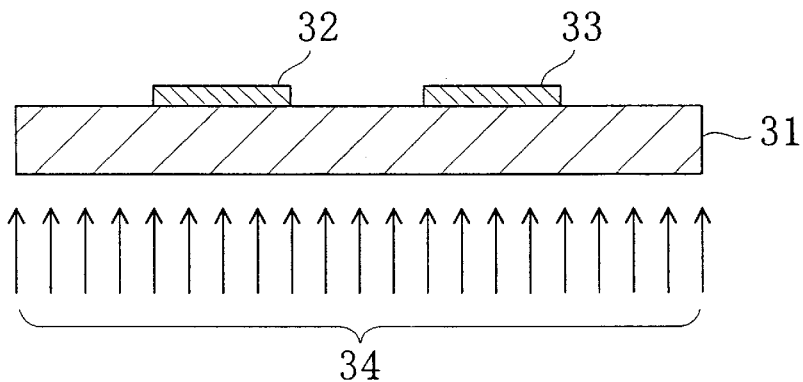
Figure 4C:
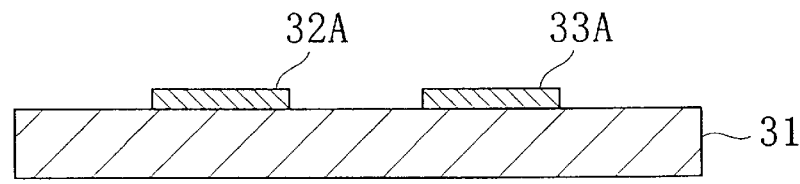

FIGS. 4(a) to 4(c) show the cross-sectional structures sequentially illustrating the process steps of a method for forming an ohmic electrode in the variant of the third embodiment of the present invention.

In this variant, the laser light 34, having a wavelength sufficiently longer than the wavelength (=h·c/Eg) corresponding to the energy associated with the band gap (=Eg) of SiC, is irradiated from below the reverse surface of the substrate 31 onto the entire reverse surface of the substrate 31. The laser light 34, having a wavelength sufficiently longer than the wavelength corresponding to the energy associated with the band gap of SiC, is hardly absorbed into the SiC substrate 31, reaches the upper surface of the substrate 31 and is absorbed into the first metal film 32 and the second metal film 33. Thus, since the interface between each metal film and the semiconductor substrate is directly heated, the electrode is not affected by the thickness of the metal film to constitute the electrode. As a result, the first ohmic electrode 32A and the second ohmic electrode 33A can be formed with more certainty.

It is noted that if the reverse surface of the substrate 31 is mirror polished so as to prevent the laser light from being scattered, the laser light can be absorbed into the metal films 32 and 33 more efficiently.

Embodiment 4

Hereinafter, the fourth embodiment of the present invention will be described with reference to the drawings.

Figure 5A:
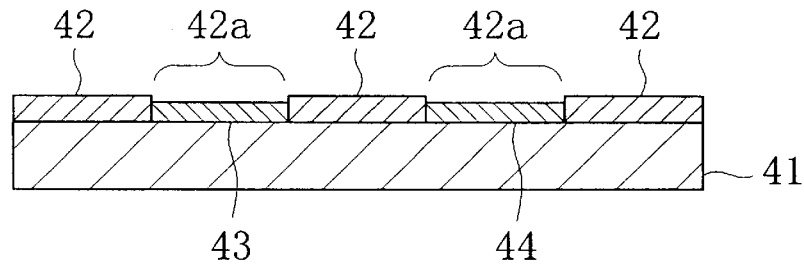
FIGS. 5(a) to 5(c) are cross-sectional views sequentially showing the process steps of a method for forming an ohmic electrode in the fourth embodiment of the present invention.
Figure 5B:
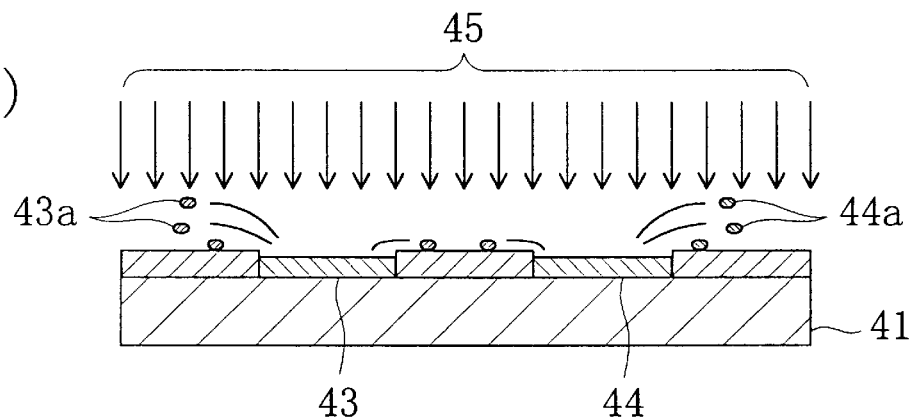
Figure 5C:
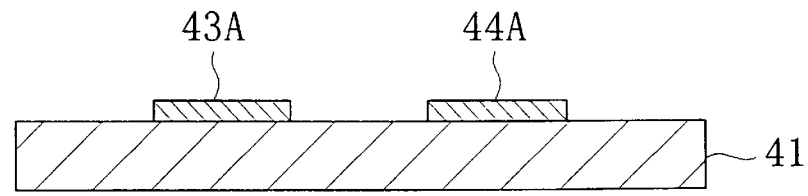
Figure 6A:
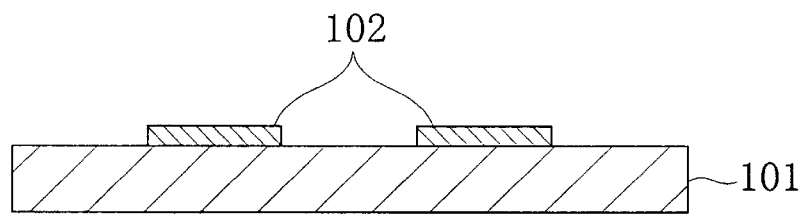
FIGS. 6(a) to 6(c) are cross-sectional views sequentially showing the process steps of a conventional method for forming an ohmic electrode in a semiconductor device.
Figure 6B:
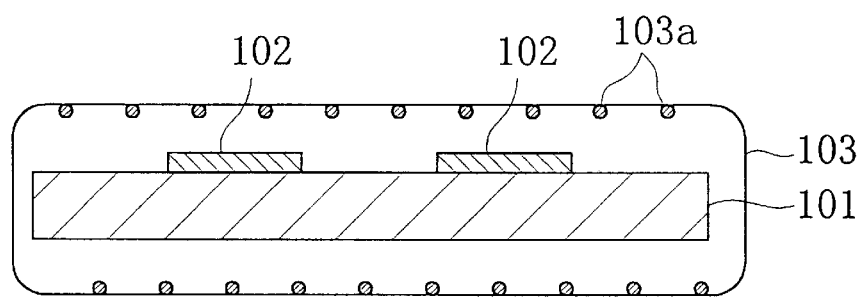
Figure 6C:
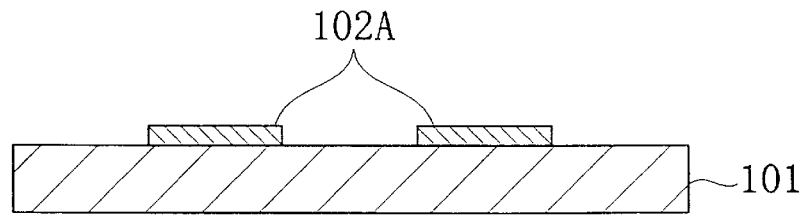

FIGS. 5(a) to 5(c) show the cross-sectional structures sequentially illustrating the process steps of a method for forming an ohmic electrode in the fourth embodiment of the present invention. First, as shown in FIG. 5(a), an insulator film 42 is deposited over the entire surface of a substrate 41 made of SiC. Then, openings 42(a) are provided for the insulator film 42 through photolithography or the like, so as to partially expose the upper surface of the substrate 41. Thereafter, a first metal film 43 and a second metal film 44, which are both made of Ni or the like, are respectively deposited in the openings 42(a).

Subsequently, as shown in FIG. 5(b), laser light 45 is irradiated from above the upper surface of the substrate 41, thereby forming a first ohmic electrode 43A and a second ohmic electrode 44A from the first metal film 43 and the second metal film 44, respectively. In this case, if the metal films are made of a material having a relatively small thermal conductivity, e.g., Ni, and are irradiated and heated with the laser light 45, then the surface metal particles 43a and 44a sometimes scatter from the surface of the metal films to the surrounding regions of the metal films, because the surface temperature of the metal films is abruptly raised.

However, in this embodiment, the insulator film 42 is formed on the substrate 41 as a protective film for the substrate 41. Thus, even when these surface metal particles 43a and 44a scatter over the insulator film 42, these particles do not attach to the surface of the substrate 41. Therefore, by removing the insulator film 42 as shown in FIG. 5(c), the substrate 41 can have a clean surface with more ease and more certainty after the ohmic electrodes have been formed.

Embodiment 5

Hereinafter, the fifth embodiment of the present invention will be described with reference to the drawings.

Figure 7:
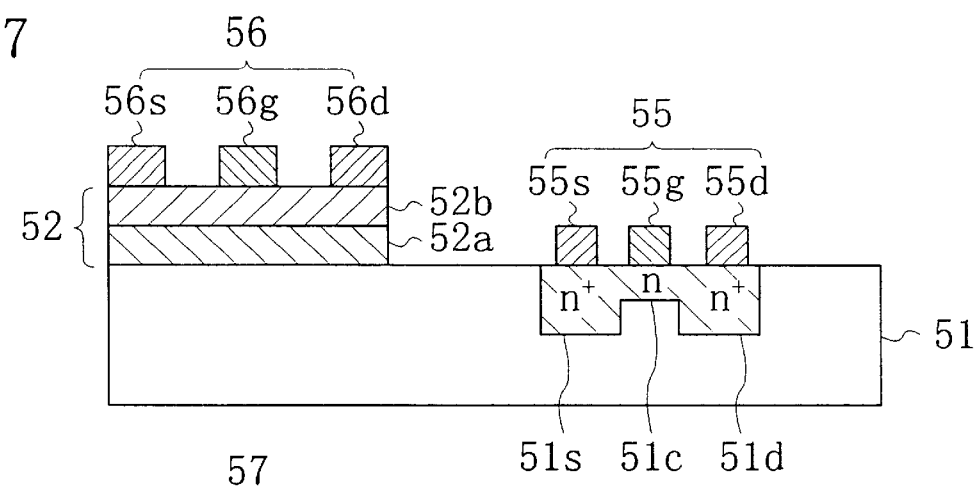
FIG. 7 is a cross-sectional view showing a structure of a semiconductor device in the fifth embodiment of the present invention.

FIG. 7 shows a cross-sectional structure for a semiconductor device in the fifth embodiment of the present invention. The semiconductor device is implemented as an MMIC in which a transmission amplifier and a reception amplifier are integrally formed. As shown in FIG. 7, an epitaxial film 52 made of $Al_xIn_yGa_{(1-x-y)}N$ (where $0 \leq x \leq 1$ and $0 \leq y \leq 1$) is selectively formed on a high-resistance or semi-insulating substrate 51 made of SiC. The epitaxial film 52 includes: a channel layer 52a made of n-type GaN; and a Schottky layer 52b made of undoped $Al_{0.2}Ga_{0.8}N$ in this order on the upper surface of the substrate 51.

A high-output amplifier section 55 having a relatively high output is formed in an exposed area of the upper surface of the substrate 51. In a part of the high-output amplifier section 55 located in the upper surface region of the substrate 51, an n$^+$-type source layer 51s and an n$^+$-type drain layer 51d are formed so as to be spaced from each other via a certain gap. Silicon ions have been implanted into these layers 51s and 51d at a high concentration. An n-type channel layer 51c, to which silicon ions have also been implanted, is further formed between the n$^+$-type source layer 51s and the n$^+$-type drain layer 51d. In addition, in the other part of the high-output amplifier section 55 located on the upper surface of the substrate 51, a gate electrode 55g having a relatively large gate width is formed on the n-type channel layer 5c, a source electrode 55s is formed on the n$^+$-type source layer 51s and a drain electrode 55d is formed on the n$^+$-type drain layer 51d, thereby constituting a MESFET using SiC.

On the other hand, a low-noise amplifier section 56 generating relatively low noise is formed on the epitaxial film 52 formed on the substrate 51. In the low-noise amplifier section 56, a gate electrode 56g having a relatively small gate width is selectively formed on the Schottky layer 52b of the epitaxial film 52, a source electrode 56s is formed along one side of the gate electrode 56g in the gate longitudinal direction, and a drain electrode 56d is formed along the other side of the gate electrode 56g in the gate longitudinal direction, thereby constituting a MESFET using a GaN group compound semiconductor.

As can be understood, in this embodiment, since a MESFET required to supply a high output for transmission is formed in the substrate 51 made of SiC, a high-output amplifier section 55 for supplying a desired output is realized by utilizing a high thermal conductivity of SiC.

In addition, since a MESFET required to exhibit low-noise characteristics for reception is formed on the epitaxial film 52 which is selectively formed on the substrate 51 and made of $Al_xIn_yGa_{(1-x-y)}N$ (where $0 \leq x \leq 1$ and $0 \leq y \leq 1$) the low-noise amplifier section 56 can exhibit excellent low-noise characteristics, because the electron mobility of GaN compound semiconductors as high as about 1000 cm.cm/Vs can be taken advantage of.

At present, no single crystalline substrate can be made of any GaN compound semiconductor. Thus, a GaN compound semiconductor is generally grown on a substrate made of sapphire. However, as described in this embodiment, since a GaN compound semiconductor can also be grown on a SiC substrate, satisfactory crystals can be obtained. Moreover, since a GaN compound semiconductor, as well as SiC, is a semiconductor having a wide band gap, the semiconductor can be used over a wide temperature range and leakage current does not increase so much even when the temperature is raised. As a result, low-noise characteristics can be maintained even in a relatively high temperature range. Consequently, such a MESFET can satisfy the ever-increasing demand for a communication device appropriate for the forthcoming highly developed multi-media society.

In this embodiment, the high-output amplifier section 55 is constituted by a MESFET. Alternatively, a MOSFET allowing for an even higher operating voltage may also be used. Furthermore, the low-noise amplifier section 56 may be constituted by a heterojunction FET having a heterojunction of AlGaN/InGaN allowing for an even higher electron mobility, instead of the GaN MESFET.

Figure 8:
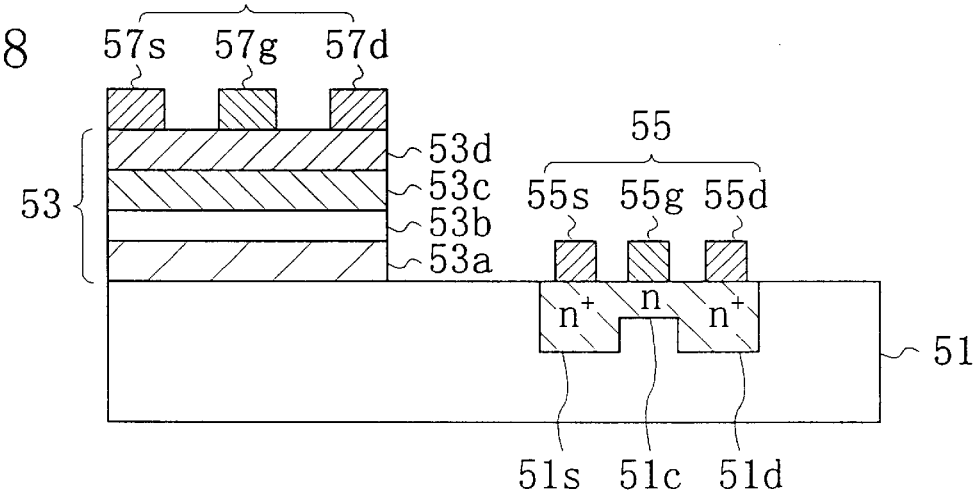
FIG. 8 is a cross-sectional view showing a structure of a semiconductor device in a variant of the fifth embodiment of the present invention.

FIG. 8 shows a cross-sectional structure for a semiconductor device in a variant of the fifth embodiment of the present invention. The semiconductor device is implemented as an MMIC in which a transmission amplifier and a reception amplifier are integrally formed by using a heterojunction FET made of AlGaN/InGaN for the low-noise amplifier section. In FIG. 8, the same components, as those shown in FIG. 7 are identified by the same reference numerals and the description thereof will be omitted herein. As shown in FIG. 8, an epitaxial film 53 made of $Al_xIn_yGa_{(1-x-y)}N$ (where $0 \leq x \leq 1$ and $0 \leq y \leq 1$) is selectively formed on the SiC substrate 51. The epitaxial film 53 includes: a first barrier layer 53a made of undoped $Al_{0.2}Ga_{0.8}N$; a channel (well) layer 53b made of undoped $In_{0.1}Ga_{0.9}N$; a second barrier layer 53c made of undoped $Al_{0.2}Ga_{0.8}N$; and a Schottky layer 53d which is made of undoped GaN and includes a delta doped layer made of silicon, in this order on the upper surface of the substrate 51. A double heterostructure is constituted by the first barrier layer 53a, the channel layer 53b and the second barrier layer 53c.

On the Schottky layer 53d, a gate electrode 57g having a relatively small gate width is formed and a source electrode 57s and a drain electrode 57d are formed along the gate electrode 57g in the gate longitudinal direction, thereby constituting a heterojunction MESFET included in the low-noise amplifier section 57.

In this heterojunction structure, since electrons can be confined in the channel layer 53b, the mobility thereof can be further increased and the low-noise characteristics can be further improved.

Embodiment 6

Hereinafter, the sixth embodiment of the present invention will be described with reference to the drawings.

Figure 9:
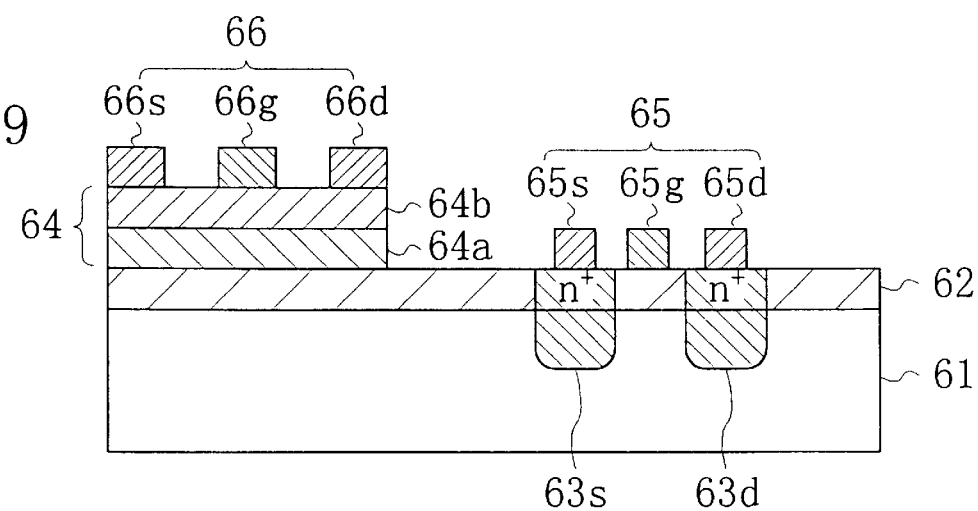
FIG. 9 is a cross-sectional view showing a structure of a semiconductor device in the sixth embodiment of the present invention.
Figure 10:
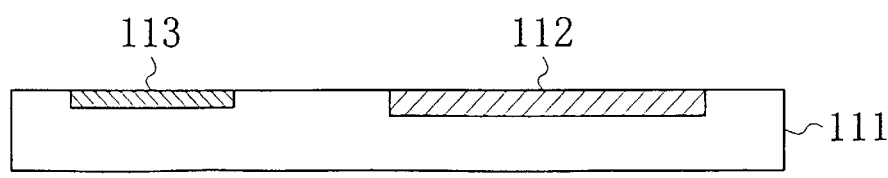
FIG. 10 is a cross-sectional view showing a structure of a conventional MMIC in which a transmission amplifier and a reception amplifier are integrally formed.

FIG. 9 shows a cross-sectional structure for a semiconductor device in the sixth embodiment of the present invention. The semiconductor device is implemented as an MMIC in which a transmission amplifier and a reception amplifier are integrally formed. The sixth embodiment is different from the fifth embodiment in that a first epitaxial film 62 made of $Al_xIn_yGa_{(1-x-y)}N$ (where $0 \leq x \leq 1$ and $0 \leq y \leq 1$) is formed over the entire surface of a substrate 61 made of SiC.

As shown in FIG. 9, the first epitaxial film 62 made of undoped $Al_{0.2}Ga_{0.8}N$ (where y=0) is formed over the entire surface of the high-resistance or semi-insulating substrate 61 made of SiC, and a second epitaxial film 64 made of $Al_xIn_yGa_{(1-x-y)}N$ (where $0 \leq x \leq 1$ and $0 \leq y \leq 1$) is selectively formed on the first epitaxial film 62. The second epitaxial film 64 includes: a buffer layer 64a made of undoped GaN; and a channel layer 64b made of n-type $Al_{0.2}Ga_{0.8}N$ in this order over the upper surface of the substrate 61.

A high-output amplifier section 65 having a relatively high output is formed in an exposed area of the upper surface of the first epitaxial film 62 on the substrate 61. In a portion of the high-output amplifier section 65 located partly in the upper surface region of the substrate 61 and partly in the first epitaxial film 62, an $n^+$-type source layer 63s and an $n^+$-type drain layer 63d are formed so as to be spaced from each other via a certain gap. Silicon ions have been implanted into these layers at a high concentration. In addition, in the other portion of the high-output amplifier section 65 located on the upper surface of the first epitaxial film 62, a source electrode 65s formed on the $n^+$-type source layer 63s, a drain electrode 65d is formed on the $n^+$-type drain layer 63d, and a gate electrode 65g having a relatively large gate width is formed between the source electrode 65s and the drain electrode 65d, thereby constituting a heterojunction MESFET having a heterostructure made of GaN/SiC. In the heterojunction MESFET, carriers drift in the interface between the first epitaxial film 62 and the substrate 61.

On the other hand, a low-noise amplifier section 66 generating relatively low noise is formed on the second epitaxial film 64 formed on the first epitaxial film 62 on the substrate 61. In the low-noise amplifier section 66, a gate electrode 66g having a relatively small gate width is selectively formed on the channel layer 64b of the second epitaxial film 64, a source electrode 66s is formed along one side of the gate electrode 66g in the gate longitudinal direction, and a drain electrode 66d is formed along the other side of the gate electrode 66g in the gate longitudinal direction, thereby constituting a MESFET using a GaN group compound semiconductor.

As can be understood, in this embodiment, since a compound semiconductor of $Al_xIn_yGa_{(1-x-y)}N$ (where $0 \leq x \leq 1$ and $0 \leq y \leq 1$) having an even larger band gap than that of SiC is used for the MESFET constituting the high-output amplifier section 65, the breakdown voltage can be further increased. In addition, since a heterostructure is made of GaN/SiC, the electron mobility can also be increased. Consequently, the electrical characteristics, such as gain, efficiency and the like, of the MESFET of this embodiment can be so improved as to be used as a radio frequency power device.

In this embodiment, AlGaN used for the first epitaxial film 61 does not lattice-match with SiC. However, if the first epitaxial film 62 has a composition represented by $Al_xIn_yGa_{(1-x-y)}N$ (where $0 \leq x \leq 1$ and $0 \leq y \leq 1$) including In, then the first epitaxial film 62 can lattice-match with SiC.

Moreover, as already described in the fifth embodiment, the low-noise amplifier section 66 may also be constituted by a heterojunction FET having a heterojunction such as AlGaN/InGaN allowing for an even higher electron mobility, not by the GaN MESFET.

What is claimed is:

1. A method for forming an ohmic electrode, comprising the steps of:

forming an insulator film on a surface of a substrate made of silicon carbide, the insulator film having an opening through which the surface of the substrate is exposed;

depositing a metal film in the opening on the substrate; and forming an ohmic electrode of the metal film by heating the metal film through irradiation of laser light onto the substrate and thereby forming an ohmic contact between the metal film and the substrate.

* * * * *